(12) United States Patent
Li

(10) Patent No.: US 8,283,623 B2
(45) Date of Patent: Oct. 9, 2012

(54) ROBUST SPECTRAL ANALYZER FOR ONE-DIMENSIONAL AND MULTI-DIMENSIONAL DATA ANALYSIS

(75) Inventor: Ta-Hsin Li, Danbury, CT (US)

(73) Assignee: International Business Machines Corporation, Armonk, NY (US)

( * ) Notice: Subject to any disclaimer, the term of this patent is extended or adjusted under 35 U.S.C. 154(b) by 1380 days.

(21) Appl. No.: 11/927,073

(22) Filed: Oct. 29, 2007

(65) Prior Publication Data

US 2009/0112954 A1    Apr. 30, 2009

(51) Int. Cl.
*G01N 21/25* (2006.01)
(52) U.S. Cl. ............. 250/227.23; 708/404; 356/303
(58) Field of Classification Search ........... 250/227.23; 708/200, 403, 404; 356/303, 939
See application file for complete search history.

(56) References Cited

U.S. PATENT DOCUMENTS

| 6,245,025 | B1 | 6/2001 | Török et al. |
| 6,297,764 | B1 | 10/2001 | Wormington et al. |
| 6,356,600 | B1 | 3/2002 | Kirsteins et al. |
| 2001/0006548 | A1 | 7/2001 | Pinier |
| 2005/0049826 | A1* | 3/2005 | Zhang ............. 702/179 |

* cited by examiner

*Primary Examiner* — Francis M Legasse, Jr.
(74) *Attorney, Agent, or Firm* — Scully, Scott, Murphy & Presser, P.C.; Daniel P. Morris, Esq.

(57) ABSTRACT

A method of analyzing a spectrum of one-dimensional or multi-dimensional signal X(t) requires a number of steps including deriving coefficients $[A_N(\omega), B_N(\omega)]$ of an Lp-norm harmonic regression of tie signal with $0<p\leq\infty$ and $p\gamma 2$, squaring the coefficients, summing the squared coefficients, and scaling the summed, squared coefficients with a constant c to realize a periodogram of X(t) as $L_N(\omega)=c\{[A_N(\omega)]+[B_N(\omega)]^2\}$. The method may include receiving the signal X(t), storing the received signal X(t), and outputting the periodogram $L_N(\omega)$. The method may still further include scanning to maximize the periodogram $L_N(\omega)$ by identifying its largest peak(s) and comparing the amplitude of the identified largest peak(s) with a threshold to determine if the largest peak(s) is(are) attributable to a presence of a periodic signal. The coefficients are preferable derived from a time series signal X(t), t=1, 2, . . . , N, but may include receiving a continuous-time signal and converting it to the time series signal.

11 Claims, 5 Drawing Sheets

ROBUST SPECTRAL ANALYZER FOR ONE-DIMENSIONAL AND MULTI-DIMENSIONAL DATA ANALYSIS

BACKGROUND OF THE INVENTION

The present invention relates to spectral analysis, and more particularly relates to a method for robust spectral analysis, suitable for both light-tailed and heavy-tailed data, a spectral analyzer, signal detector and receiver system, which operates in accordance with the novel spectral analysis method.

The spectral density or power spectral density of a signal describes how the energy or variance of a signal or time series is distributed with frequency. Spectral analysis is a widely used method for analyzing the serial and mutual dependence of one-dimensional and multi-dimensional time series data, and has important applications in science and engineering. For example, spectral analysis is applied in signal and image analyses, target detection techniques, pattern recognition and frequency estimation analyses. If f(t) is a finite-energy (square integrable) signal, the spectral density ($\Phi(\omega)$) of the signal is the square of the magnitude of the continuous Fourier Transform of the signal, where energy is the integral of the square of the signal, which is the same as physical energy if the signal is a voltage applied to a 1 ohm load.

A periodogram is an estimate of the true spectral density of a signal. Conventionally, a periodogram is computed from a finite-length digital sequence using the fast Fourier transform (FFT). Conventional techniques of spectral analyses, including periodograms and autoregressive models, are known to lack robustness for heavy-tailed data, resulting in poor performance in situations such as outlier contamination. As used herein, heavy-tailed and light-tailed distributions are terms that are used to denote distributions that are relative to Gaussian distributions, wherein the heavy tailed data have outliers in the data. For example, uniform distributions have lighter tails (less outliers) than Gaussian distributions; Student's T distributions and Laplace distributions are heavy-tailed distributions, wherein Cauchy distributions may be described as very heavy-tailed distributions.

Periodograms provide an estimate of the true spectral density of a signal. Periodograms are often computed from finite-length digital sequences using Fast Fourier transforms (FFTs). Typically, raw periodograms are not good spectral estimates because of statistical variability in view of the fact that the variance at a given frequency does not decrease as the number of samples used in the computation increases. This problem may be reduced by using spectral smoothing, and data tapering techniques.

What would be desirable in the field of spectral analysis, and in particular, spectral analyses for heavy tailed data and for data corrupted by heavy-tailed noise, is a method for providing a robust spectral analysis for time series signals including both light-tailed and heavy-tailed data, a signal detector and a receiver system that operate in accordance with the method.

SUMMARY OF THE INVENTION

To that end, this invention provides a method for robust spectral analysis, suitable for both light-tailed and heavy-tailed data.

This inventive method, application program which implements the method and computer system operating in accordance with such inventive method are constructed in the recognition that conventional periodograms of time series, defined as the squared magnitude of the Fourier transform of the time series data, may also be derived from a procedure of least-squares (L2-norm) linear regression, wherein linear combinations of sinusoids (sine and cosine functions) are fit to the time series data, the coefficients of which are obtained by minimizing the sum of squared fitting errors. But instead of L2-norm, the instant invention obtains the regression coefficients by minimizing the Lp-norm of the fitting errors, wherein p may be any positive number different from 2.

More particularly, the regression coefficients can be obtained using the L1-norm (i.e., by the method of least absolute deviations), wherein the sum of squared coefficients of the least absolute deviations regression is a periodogram-like function. The novel periodogram-like function is referred to herein as a Laplace periodogram. As compared with the Fourier transform-based conventional periodogram, the Laplace periodogram of the invention has a number of advantages. These advantages include that the inventive Laplace periodogram is less sensitive to outliers, is less susceptible to statistical variability for heavy-tailed data, realizes greater or improved detection power and accuracy for detecting and estimating sinusoidal signals in heavy-tailed noise, is invariant (up to a scaling factor) under sign-preserving memoryless transformation, is more reliable than clipping techniques, and is applicable to both gridded and non-gridded data, is applicable to data with missing values.

BRIEF DESCRIPTION OF THE DRAWING FIGURES

The foregoing and other objects, aspects and advantages will be better understood from the following detailed description of embodiments of the inventions, with reference to the drawings, in which.

Figure 3A:
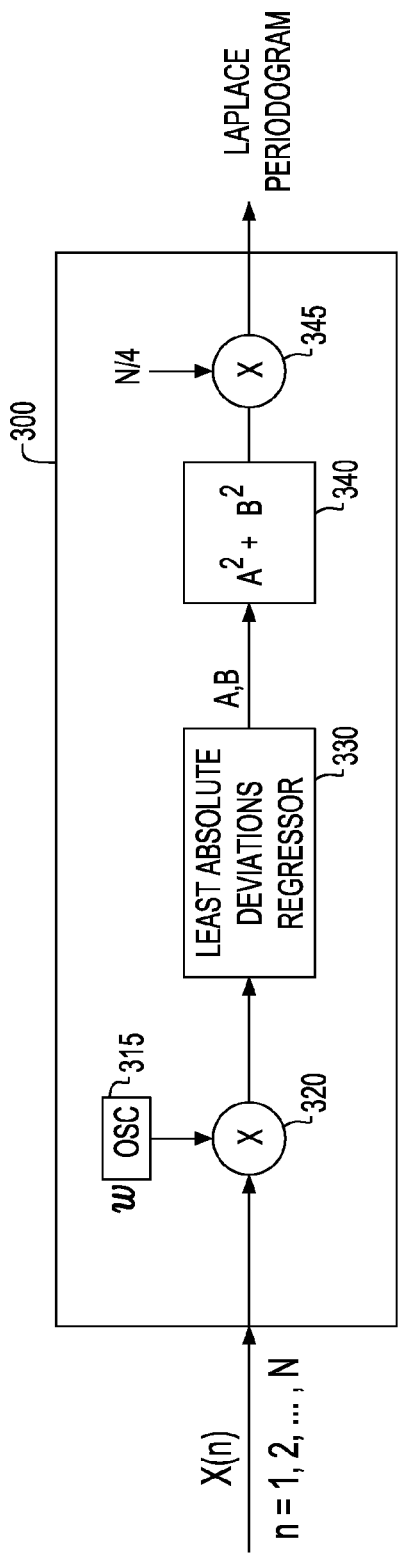
FIG. 3(a) is a schematic diagram depicting a novel signal analyzer 300, for receiving a real-valued time series signal [X(n), n=1, 2, ..., N], and processing the time series to output the Laplace periodogram of same.
Figure 3B:
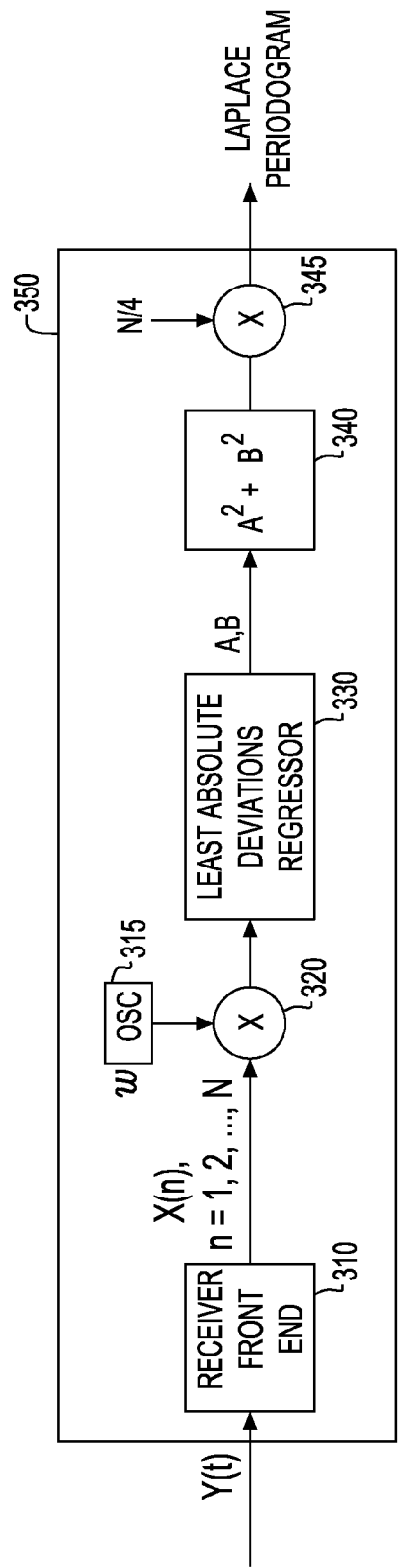
Figure 4:
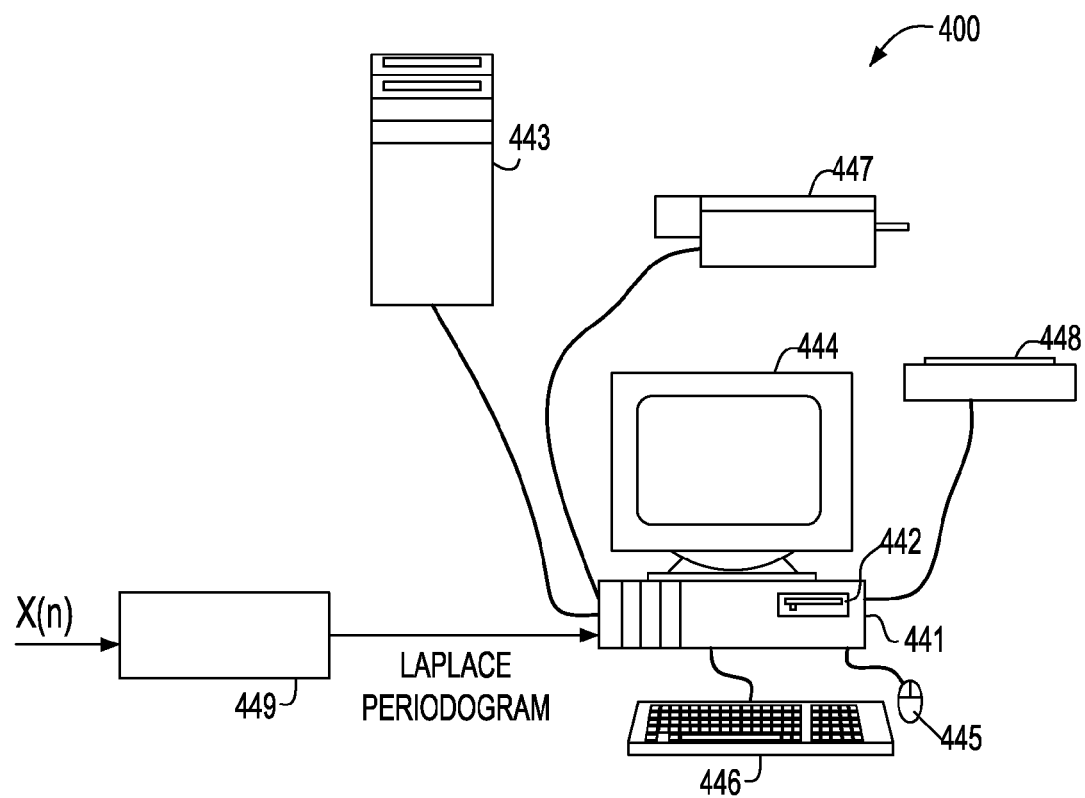

FIG. 3(b) is a schematic diagram depicting a novel receiver 350, for receiving an analog signal Y(t), converting the signal to a real-valued time series signal [X(n), n=1, 2, ..., N] and generating the novel Laplace periodogram therefrom; and FIG. 4 is a schematic representation of a computer-based system 400 by which the novel method for analyzing a spectrum of a real-valued time series signal [X(n), n=1, 2, ..., N] using the novel Laplace periodogram of the present invention is carried out.

DETAILED DESCRIPTION OF THE INVENTION

The detailed description of the invention and its various embodiments and implementations requires the following definitions. Let $\{X(t), t=1, 2, \ldots, N\}$ be a real-valued time series of length N. Then, for any fixed real value $\omega$, let $A_N(\omega)$ and $B_N(\omega)$ be a minimizer of $$\Sigma |X(t)-[A\cos(\omega t)+B\sin(\omega t)]|,$$

where $\Sigma$ denotes the sum over $t=1, 2, \ldots, N$. The Laplace periodogram of $\{X(t)\}$ is defined as $$L_N(\omega)=0.25N\{[A_N(\omega)]^2+[B_N(\omega)]^2\}.$$

The novel Laplace periodogram as defined may be used as a spectral analyzer for analyzing the serial dependence of a time series, which ability may be verified by the following postulate. That is:

If $\{X(t)\}$ is a (zero-mean, zero-median) stationary process having a marginal probability density $f(x)$, then, as N approaches infinity, $L_N(\omega)$ is distributed as $$0.5\eta^2 S(\omega)Z,$$

where Z represents a random variable which has a chi-square distribution with 2 degrees of freedom, $\eta^2=1/[2f(0)]^2$, and $S(\omega)$ is the zero-crossing spectrum of $\{X(t)\}$ defined as $$S(\omega)=\Sigma\gamma(\tau)\cos(\omega\tau),$$

with $\gamma(\tau)=1-2\Pr\{X(t)X(t+\tau)<0\}$ being the standardized lag-$\tau$ zero-crossing rate, and with $\Sigma$ denoting the sum over $\tau=\ldots, -2, -1, 0, 1, 2, \ldots$. In comparison with $0.5\eta^2 S(\omega)Z$, the asymptotic distribution of the conventional periodogram is $$0.5\sigma^2 R(\omega)Z,$$

where $\sigma^2$ is the variance of $\{X(t)\}$, and $R(\omega)$ is the autocorrelation spectrum of $\{X(t)\}$ defined as $$R(\omega)=\Sigma\rho(\tau)\cos(\omega\tau),$$

with $\rho(\tau)=E\{X(t)X(t+\tau)\}/\sigma^2$ being the lag-$\tau$ autocorrelation coefficient. Like the autocorrelation coefficients, the zero-crossing rates are measures of serial dependence of the time series from a different perspective. The equations $0.5\eta^2 S(\omega)Z$, $S(\omega)=\Sigma\gamma(\tau)\cos(\omega\tau)$, $0.5\sigma^2 R(\omega)Z$ and $R(\omega)=\Sigma\rho(\tau)\cos(\omega\tau)$, show that the Laplace periodogram in effect simply substitutes the autocorrelation coefficients with the zero-crossing rates so that the serial dependence of the time series is examined through the zero-crossing spectrum instead of the ordinary power spectrum.

Because the Laplace periodogram is based on L1-norm (least absolute deviations) regression instead of L2-norm (least squares) regression, it is endowed with robustness against outliers in the same way as the median versus the mean. As a result, the Laplace periodogram is more reliable for analyzing data with heavy-tail distributions and for detecting signals buried in heavy-tailed noise.

Figure 1:
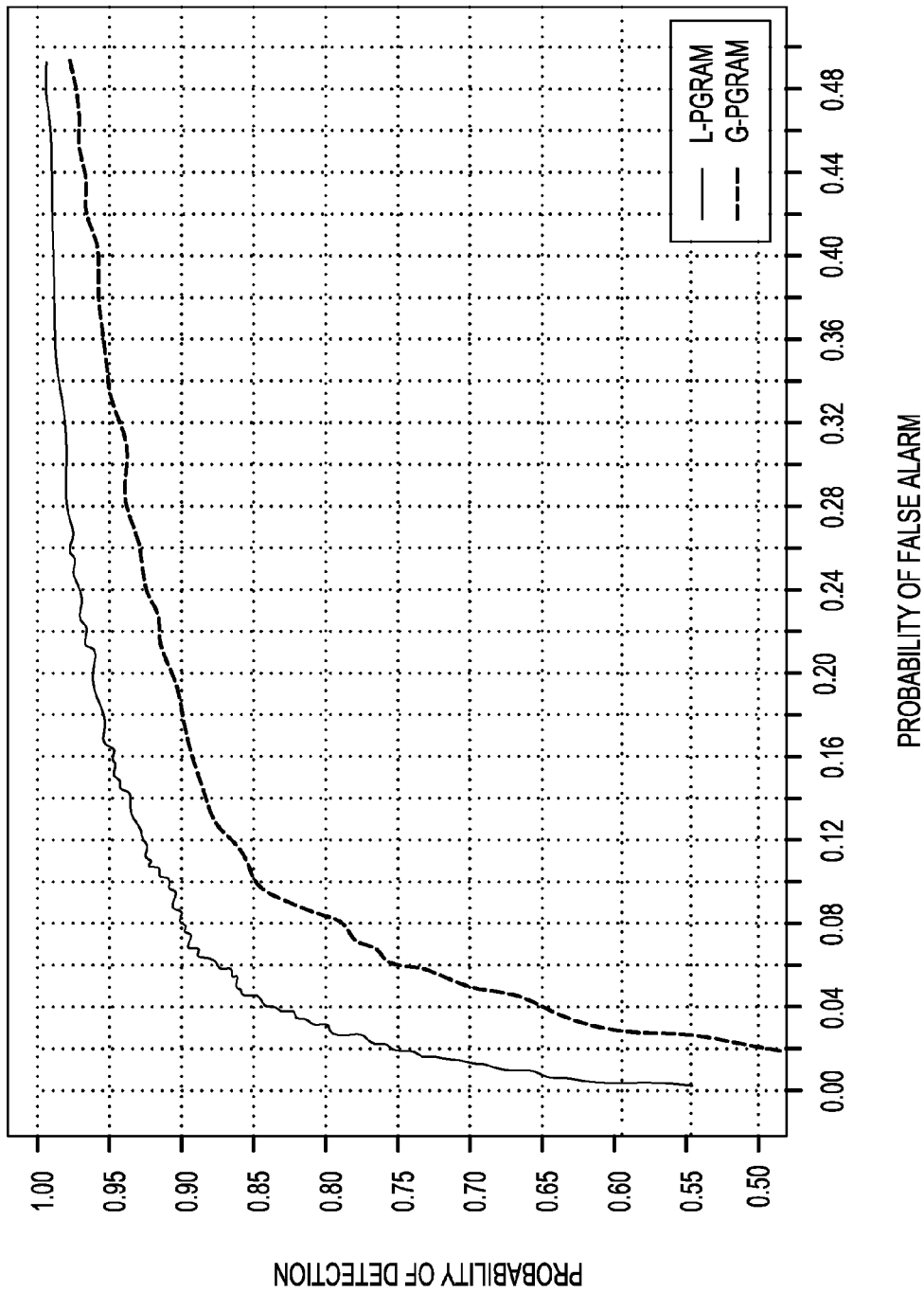
FIG. 1 is graphical depiction of a receiver operating characteristic (ROC) curve for detecting a sinusoidal signal in heavy tailed noise using both a conventional periodogram (dashed line), and the novel Laplace periodogram (solid line)

As an example, FIG. 1 herein depicts the receiver operating characteristic (ROC) curves for detecting a sinusoidal signal in heavy-tailed noise using the Laplace periodogram of the present invention and a conventional periodogram. In FIG. 1, the solid line is representative of the receiver operating characteristics (ROCs) for the Laplace periodogram, and the dotted line is the ROCs for the conventional periodogram. Clearly, the Laplace periodogram has greater receiver detection power than the conventional periodogram for any false-alarm probability.

Figure 2A:
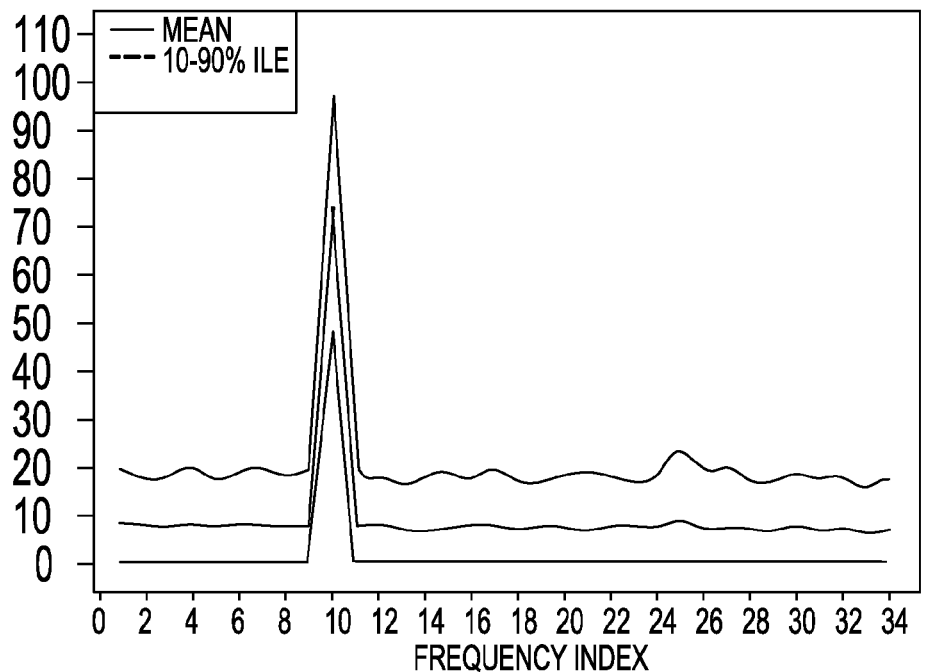
FIG. 2(a) is a graphical depiction of the average and 10-90% quantiles of the novel Laplace periodogram from 100 independent realizations of a random process, which comprises a sinusoid and Cauchy white noise.
Figure 2B:
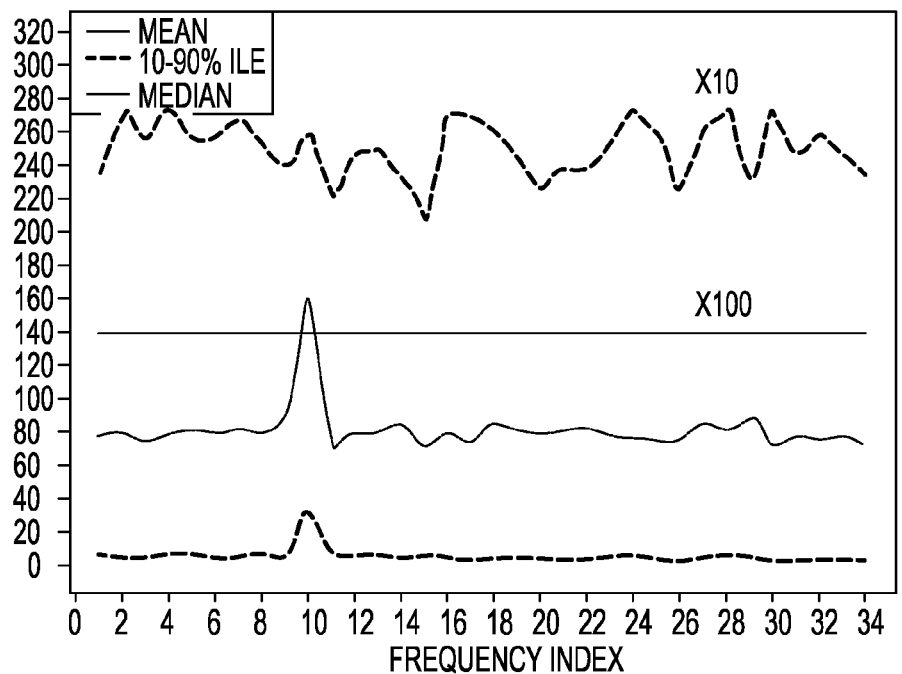
FIG. 2(b) is a graphical depiction of the average and 10-90% quantiles of a conventional periodogram of 100 independent realizations of a random process, which comprises a sinusoid and Cauchy white noise, such as was depicted in FIG. 2(a)

As another example, FIG. 2(a) herein depicts an average, and 10-90% quantiles of the novel Laplace periodogram from 100 independent realizations of random processes that consist of a sinusoid plus Cauchy white noise. FIG. 2(b) herein depicts the same quantities for the conventional periodogram. Clearly, the novel Laplace periodogram correctly depicts the spectrum of the time series, whereas the conventional periodogram as shown fails to do so because of its enormous statistical variability (i.e., lack of robustness).

Figure 2C:
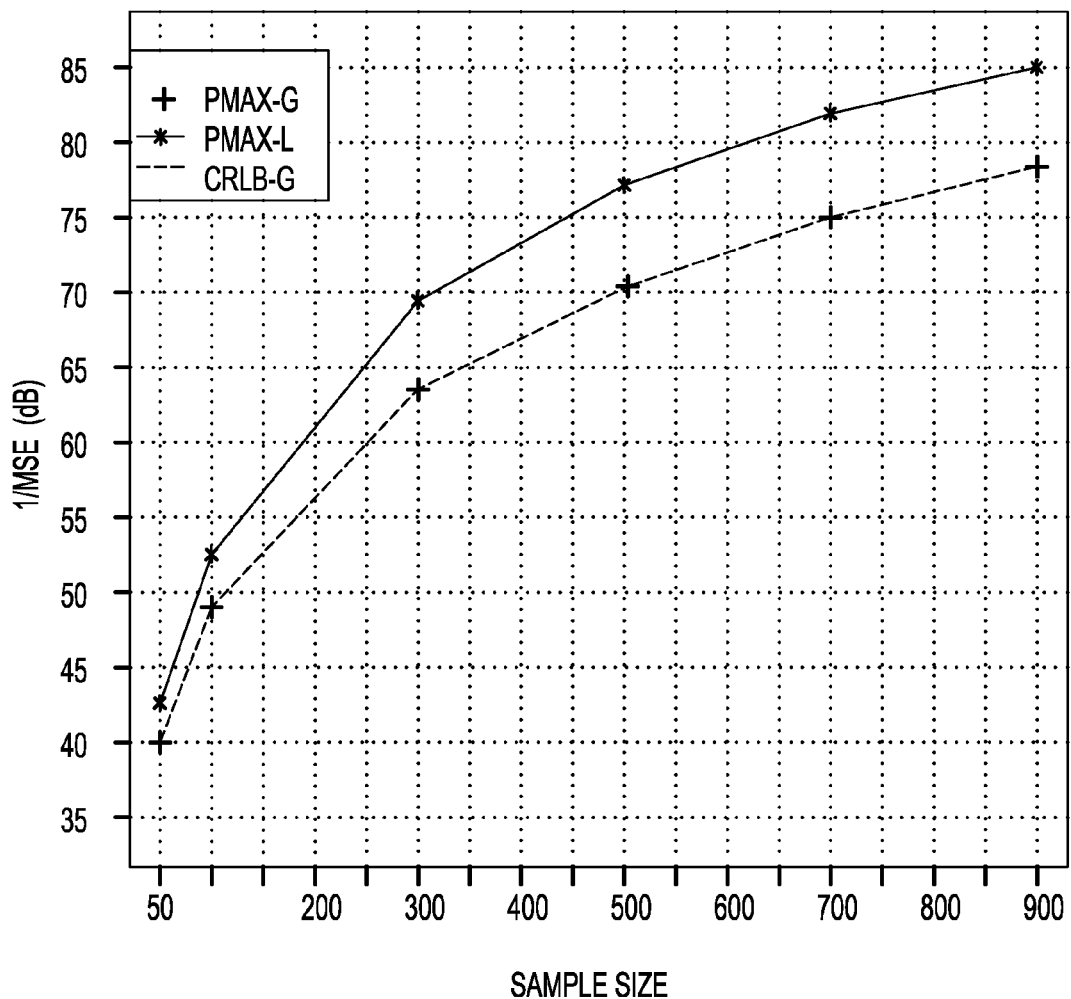
FIG. 2(c) is a graphical depiction of the reciprocal mean square error of a Laplace-periodogram-based frequency estimator for 1000 independent realizations of a random process that consists of a sinusoidal signal corrupted by heavy-tailed white noise.

If the frequency of a sinusoidal signal is not known, the invention provides for scanning, or evaluating the Laplace periodogram to find the location of a "largest" peak as an estimate of the unknown frequency, and then comparing the amplitude of same largest peak with a threshold in order to determine whether the periodogram derives from a noisy sinusoidal signal. The Laplace periodogram further provides for an improved mean-square error for frequency estimation as compared with mean-square error in frequency estimation using the conventional periodogram. As an example, FIG. 2(c) herein depicts the reciprocal mean-square error of a Laplace-periodogram-based frequency estimator (PMAX-L) for 1000 independent realizations of a random process, which consists of a sinusoidal signal in heavy-tailed white noise (solid curve with asterisk). Also depicted in FIG. 2(c) is the reciprocal mean-square error of a frequency estimator (PMAX-G) obtained from the conventional periodogram (cross). In this figure, CRLB-G (dashed line) stands for the Cramer-Rao lower bound under the assumption of Gaussian white noise. As can be seen, the frequency estimator derived from the novel Laplace periodogram has a much smaller mean-square error than the frequency estimator based on the conventional periodogram.

The inventive concept of the novel Laplace periodogram may be generalized in a number of directions, including: (a) replacement of the L1-norm regression with the Lp-norm regression for some positive number p, which is different from 2; (b) replacement of gridded time series data with irregularly spaced data; (c) replacement of one-dimensional data with multi-dimensional data; and (d) replacement of real-valued data with complex-valued data.

For example, by replacing the L1-norm regression with an Lp-norm regression for some p>1, the resulting novel periodogram $L_N(\omega)=0.25\,N\{[A_N(\omega)]^2+[B_N(\omega)]^2\}$ is asymptotically distributed as:

$$0.5\eta_p^2 S_p(\omega)Z,$$

where $\eta_p^2=c_p(0)/[(p-1)c_{p/2}(0)]^2$, $c_p(0)=E\{|X(t)|^{2p-2}\}$, $c_{p/2}(0)=E\{|X(t)|^{p-2}\}$, $S_p(\omega)=r_p(\tau)\cos(\omega\tau)$, and $r_p(\tau)=\Sigma\{|X(t)|^{p-1}\text{sgn}(X(t))|X(t+\tau)|^{p-4}\text{sgn}(X(t+\tau))\}/c_p(0)$. In the last expression, $r_p(\tau)$ is called the lag-$\tau$ fractional autocorrelation coefficient of order p. Therefore, the novel periodogram derived from the Lp-norm regression performs, in effect, a Fourier analysis of the fractional autocorrelation function $r_p(\tau)$ through its relationship with what we call the pth-order fractional autocorrelation spectrum $S_p(\omega)=\Sigma r_p(\tau)\cos(\omega\tau)$.

In most general terms, let $\{Z(t_k)=X(t_k)+iY(t_k), k=1, \ldots, N\}$ be a collection of N real- or complex-valued data points obtained at d-dimensional locations $t_k=[t_k(1), \ldots, t_k(d)]$, $k=1, \ldots, N\}$ for some positive integer d, where i denotes the square root of $-1$. For any real-valued d-dimensional vector $\omega=[\omega(1), \ldots, \omega(d)]$, let $A_N(\omega)$ and $B_N(\omega)$ be the minimizer of $$\Sigma\{|X(t_k)-[A\cos(\omega^T t_k)+B\sin(\omega^T t_k)]|^p+|Y(t_k)-[-A\sin(\omega^T t_k)+B\cos(\omega^T t_k)]|^p\}$$

where $\Sigma$ denotes the sum over $k=1, 2, \ldots, N$, and superscript T denote vector transpose. Then, the d-dimensional Lp-norm periodogram is defined as $$L_N(\omega)=c\{[A_N(\omega)]^2+[B_N(\omega)]^2\}$$

where c>0 is an appropriate normalizing constant.

Any conventional optimization solvers known to the skilled artisan may be employed to obtain the minimizer of the function $\Sigma|X(t)-[A\cos(t)+B\sin(t)]|$, or the function $\Sigma\{|X$ $(t_k)-[A\cos(\omega^T t_k)+B\sin(\omega^T t_k)]|^p+|Y(t_k)-[-A\sin(\omega^T t_k)+B\cos(\omega^T t_k)]|^p\}$. For p=1, in particular, the optimization problem can be solved as a linear programming (LP) problem, and possible solvers include simplex algorithms, and interior-point algorithms. Once the minimizer becomes available for each ω, the periodogram in equation $L_N(\omega)=c\{[A_N(\omega)]^2+[B_N(\omega)]^2\}$ can be easily obtained by summing the squared coefficients following by a proper scaling.

FIG. 3(a) herein depicts a novel spectral analyzer 300 for processing a real-valued digital signal, [X(n), n=1, 2, ..., N] to obtain the Laplace periodogram in accordance with the inventive principles. Spectral analyzer 300 receives the digital signal, which is received in a form of a real-valued time series, and then mixes the real-valued time series with sinusoidal signals cos(ωn) and sin(ωn) provided by oscillator 315, at an angular frequency ω, by first mixer 320. The mixed signal is then processed by a least absolute deviations regressor 330. The least absolute deviations regressor operates upon the sinusoidally mixed real-valued time series signal to realize signal coefficients A and B. A square function 340 squares the signal coefficients A and B, and sums them as $A^2+B^2$. The sum of the squared coefficients is thereafter scaled by a scaling coefficient, for example, N/4, as shown in the figure, using a second mixer 345. The mixer output is a Laplace periodogram of the real-valued time series signal, or $L_N(\omega)$. The spectral analyzer 300 may operate on the incoming real-value time series by mixing with different values of ω to produce the Laplace periodograms at different frequencies (values of ω).

FIG. 3(b) herein depicts a novel receiver 350 for processing a real-valued analog signal Y(t) to obtain the Laplace periodogram. Receiver 350, which is quite similar in operation to signal analyzer 300 of FIG. 3(a), includes a receiver (Rcv'r) front end 310, as well as the spectral analyzer components 315, 320, 330, 340, and 345 described with respect to FIG. 3(a). The receiver front end 310 is a conventional receiver circuit 310 for receiving the analog input signals and converting the analog signals into a real-valued time series (digital signal), by use of conventional analog to digital conversion functionalities (not shown in the figure). That is, the receiver front end 310 receives and converts Y(t) to digital signal, [X(n), n=1, 2, ..., N], which is then mixed by the first mixer 320 with sinusoidal signals cos(ωn) and sin(ωn) provided by oscillator 315 at an angular frequency ω, as discussed above with respect to spectral analyzer 3(a).

The mixed signal is then processed by a least absolute deviations regressor 330 to realize signal coefficients A, B. A square function 340 squares the signal coefficients A and B, and sums them as $A^2+B^2$. The sum is scaled by a scaling coefficient, for example, N/4 as shown in the figure, by second mixer 145. The Laplace periodogram of the real-valued time series signal, or $L_N(\omega)$ is realized as the output. The spectral analysis function, facilitated by elements 315, 320, 330, 340, and 345 as shown may be repeated for different values of ω to produce the Laplace periodogram at different frequencies. This may be helpful when attempting to detect a signal at unknown frequency, or at multiple frequencies (ω).

The various method embodiments of the invention will be generally implemented by a computer executing a sequence of program instructions for carrying out the steps of the methods, assuming all required data for processing is accessible to the computer. The sequence of program instructions may be embodied in a computer program product comprising media storing the program instructions. A computer-based system 400 is depicted in FIG. 4 herein by which the method of the present invention may be carried out. Computer system 400 includes a processing unit 441, which houses a processor, memory and other systems components that implement a general purpose processing system or computer that may execute a computer program product comprising media, for example a compact storage medium such as a compact disc, which may be read by processing unit 441 through disc drive 442, or any means known to the skilled artisan for providing the computer program product to the general purpose processing system for execution thereby.

The program product may also be stored on hard disk drives within processing unit 441 or may be located on a remote system, such as a server 443, coupled to processing unit 441, via a network interface, such as an Ethernet interface. Monitor 444, mouse 445 and keyboard 446 are coupled to processing unit 441, to provide user interaction. Scanner 447 and printer 448 are provided for document input and output. Printer 448 is shown coupled to processing unit 441 via a network connection, but may be coupled directly to the processing unit. Scanner 447 is shown coupled to processing unit 441 directly, but it should be understood that peripherals may be network coupled or direct coupled without affecting the ability of workstation computer 440 to perform the method of the invention.

A spectral analyzer 449, equivalent to a spectral analyzer 300 of the invention such as spectral analyzer 300 depicted in FIG. 3(a), constructed to receive and operate upon digital real valued time series signals including heavy-tailed and/or light-tailed to produce the Laplace periodogram of the invention is shown connected to processing unit 441. The reader should note that spectral analyzer 449 of FIG. 4 may also embody a receiver constructed in accordance with the invention, such as receiver 350 of FIG. 3(b), which essentially comprises the spectrum analyzer with a receiver front end for receiving and converting analog input signals to the real valued time series signal for processing. Processing unit 441 receives and processes the Laplace periodogram outputs to produce functionalities such as signal detection and frequency estimation.

As will be readily apparent to those skilled in the art, the present invention can be realized in hardware, software, or a combination of hardware and software. Any kind of computer/server system(s)—or other apparatus adapted for carrying out the methods described herein—is suited. A typical combination of hardware and software could be a general-purpose computer system with a computer program that, when loaded and executed, carries out the respective methods described herein. Alternatively, a specific use computer, containing specialized hardware for carrying out one or more of the functional tasks of the invention, could be utilized.

The present invention, or aspects of the invention, can also be embodied in a computer program product, which comprises all the respective features enabling the implementation of the methods described herein, and which—when loaded in a computer system—is able to carry out these methods. Computer program, software program, program, or software, in the present context mean any expression, in any language, code or notation, of a set of instructions intended to cause a system having an information processing capability to perform a particular function either directly or after either or both of the following: (a) conversion to another language, code or notation; and/or (b) reproduction in a different material form.

Although a few examples of the present invention have been shown and described, it would be appreciated by those skilled in the art that changes may be made in these embodiments without departing from the principles and spirit of the invention, the scope of which is defined in the claims and their equivalents.

What is claimed is:

1. A method of analyzing a spectrum of a real-valued time series signal $[X(t), t=1, 2, \ldots, N]$, comprising the steps of, deriving coefficients $[A_N(\omega), B_N(\omega)]$ of an Lp-norm harmonic regression of the real-valued time series signal with $0 < p \leq \infty$ and $p\gamma 2$;

squaring the coefficients;

summing the squared coefficients; and scaling the summed, squared coefficients by a positive constant c to realize an Lp-norm periodogram of X(t) as $L_N(\omega) = c\{[A_N(\omega)]^2 + [B_N(\omega)]^2\}$.

2. The method as set forth in claim 1, further comprising steps of:

receiving the real-valued time series signal $[X(t), t=1, 2, \ldots, N]$; and storing the received real-valued time series signal $[X(t), t=1, 2, \ldots, N]$.

3. The method as set forth in claim 1, further comprising a step of outputting the Lp-norm periodogram, $L_N(\omega) = c\{[A_N(\omega)]^2 + [B_N(\omega)]^2\}$.

4. The method as set forth in claim 3, further comprising a step of storing the Lp-norm periodogram, $L_N(\omega) = c\{[A_N(\omega)]^2 + [B_N(\omega)]^2\}$.

5. The method as set forth in claim 1, wherein the coefficients of the Lp-norm harmonic regression representation of the real-valued time series signal are obtained using a simplex algorithm.

6. The method as set forth in claim 1, wherein the coefficients of the Lp-norm harmonic regression representation of the real-valued time series signal are obtained using an interior-point algorithm.

7. The method as set forth in claim 1, wherein the Lp-norm harmonic regression includes the L1-norm harmonic regression that produces the Laplace periodogram.

8. The method as set forth in claim 1, wherein the L1-norm harmonic regression may comprise any one of the following: least absolute deviations (LAD), least absolute errors (LAE), least absolute values (LAV) and median regression.

9. The method as set forth in claim 1, further comprising steps of:

scanning to maximize the Lp-norm periodogram by identifying its largest peak(s); and comparing the amplitude of the identified largest peak(s) with a threshold to determine if the largest peak(s) is(are) attributable to a presence of a periodic signal within the real-valued time series signal.

10. The method as set forth in claim 9, wherein the largest peak(s) of the Lp-norm periodogram provides an accurate estimate of the frequency of the identified periodic signal within the time series.

11. The method as set forth in claim 1, further comprising:

receiving a real-valued, continuous-time signal, Y(t); and converting the real-valued, continuous-time signal to the real-valued time series signal $[X(n), n=1, 2, \ldots, N]$.

* * * * *